United States Patent [19]

Theisen et al.

[11] Patent Number: 4,702,003
[45] Date of Patent: Oct. 27, 1987

[54] METHOD OF FABRICATING A FREESTANDING SEMICONDUCTOR CONNECTION

[75] Inventors: William M. Theisen, Madison; Charles D. Wiseman, Cottage Grove, both of Wis.

[73] Assignee: The BOC Group, Inc., Montvale, N.J.

[21] Appl. No.: 743,112

[22] Filed: Jun. 10, 1985

[51] Int. Cl.⁴ .................................................. H05K 3/20
[52] U.S. Cl. .......................................... 29/840; 29/843
[58] Field of Search .................. 29/840, 842, 843, 845, 29/831

[56] References Cited

U.S. PATENT DOCUMENTS

| | | | |
|---|---|---|---|
| 3,330,026 | 7/1967 | Best et al. | 29/846 X |
| 4,268,956 | 5/1981 | Parks et al. | 29/846 X |
| 4,438,561 | 3/1984 | Mueller | 29/846 X |

Primary Examiner—Timothy V. Eley
Attorney, Agent, or Firm—Roger M. Rathbun; Larry R. Cassett

[57] ABSTRACT

A method is disclosed for bonding a minute semiconductor device to the freestanding end of a flexible microcircuit. The method generally comprises a series of steps including initially bonding the semiconductor device to a substrate for handling during the further progression of steps. An extremely minute conductive ball is bonded to one or more conductive surfaces of the semiconductor device and an upwardly depending pigtail is formed atop each of the conductive balls. The flexible microcircuit, having holes in predetermined locations and in numbers corresponding to the upwardly depending pigtails, is positioned atop those pigtails such that a portion of each pigtail protrudes through the flexible microcircuit. Another minute conductive ball is thereafter applied to each of those portions of pigtails protruding through the flexible microcircuit, thus sandwiching the microcircuit between the conductive balls. The final result is a semiconductor device attached to the distal, free end of the flexible microcircuit of sufficient minuteness such that the semiconductor and distal end of the microcircuit can be inserted into a patient's blood vessel for in vivo detection and monitoring of various parameters.

6 Claims, 3 Drawing Figures

A

D

B

E

C

F

METHOD OF FABRICATING A FREESTANDING SEMICONDUCTOR CONNECTION

BACKGROUND OF THE INVENTION

This invention relates to a method of producing a semiconductor device, such as a JFET, that is freely suspended upon a flexible microcircuit, and more particularly, to a means of joining the flexible microcircuit to the semiconductor with electrical connection therebetween.

In the past, various means have been used for attaching conductors to semiconductor devices, including the use of gold ball bonding machines that are specifically manufactured for providing wiring to semiconductors. In the typical use of a ball bonding machine a gold capillary wire is positioned over the conductive layer on the semiconductor device by means of a built-in microscope. A gold ball is formed on the free end of the capillary wire and the capillary wire is thus positioned to touch the desired conductive area of the semiconductor device. A combination of heat and ultrasonic energy is applied by the gold ball bonding machine to heat the gold capillary wire and thereby attach the gold ball to the conductive surface of the semiconductor device. The gold ball bonding machine is then moved to a second location normally on a gold plated can to which the semiconductor device is affixed and the capillary gold wire is played out through a needle to move to the second location where the machine again positions that wire to a desired location on the gold can and a wedge bond is formed, again by the application of heat and ultrasonic energy. Upon removing the machine from the wedge bond, the capillary gold wire normally breaks off from stresses encountered in forming the wedge bond, thereby leaving only a gold connection wire acting as a conductor between the semiconductor device and its mounting can.

In following the procedure of conventional gold ball bondinq machines, therefore, two connections are normally made with the gold capillary wire. The first is a gold ball bond that is applied to one of the conductive surfaces of the semiconductor device and the second is a wedge bond on the supporting can, the gold capillary wire joins the two bonds and provides an electrical connection between the supporting can and the extremely tiny microscopic conductive portions of the semiconductor device.

SUMMARY OF THE INVENTION

While the conventional gold ball bonding techniques are acceptable for semiconductors that are mounted upon cans or other relative larger, stable supportive structures, the present invention is concerned with techniques utilized to make a semiconductor device that in its final form is suspended on the end of a flexible microcircuit, such that the eventual product is a freestanding semiconductor particularly suitable for certain purposes. The techniques of joining the semiconductor to such a flexible microcircuit are thus unique as opposed to semiconductors that are mounted on stationary supportive cans.

A specific application to which the freestanding semiconductor approach is particularly applicable is in the production of in vivo sensing devices; that is where a sensing device in the form of a specific semiconductor is insertable into the blood stream of a living patient. For such applications the overall sensing device must not only be micro-dimensional, but must be sufficiently flexible so as to be inserted through a catheter into the blood vessel such as an artery or vein.

Typical semiconductors useable for this purpose are JFETs being about 17 mils by 17 mils in size or a MOSFETs, one of which is shown and described in Guckel, U.S. Pat. No. 4,180,771. Due to the size of such device, it is obviously extremely difficult to attach conductors to the device and which conductors must also be sufficiently micro-dimensional and flexible as to be inserted and retained within the blood vessel without impeding the flow of blood therein. In the invention to be described, the bonding techniques are employed to join the semiconductor to the end of a flexible microcircuit that may be approximately 1–2 mils thick and less than 20 mils in width.

Accordingly, the technique of the present invention allows the attachment of a semiconductor to a flexible microcircuit wherein no further support is provided to the device; in essence it is suspended on the end of the flexible microcircuit and where the flexible microcircuit is electrically connected to the microcircuit conductive areas of the semiconductor device.

As the initial step in the method of this invention, a semiconductor device is secured to a substrate for ease in handling. The method of securing may be by bonding with a commercial adhesive; thereafter, the substrate containing the semiconductor device is positioned in a gold ball bonding machine for the further steps in this method.

Using a gold ball bonding machine, the gold capillary wire is initially positioned over one of the conductive surfaces of the semiconductor device. Positioning is provided through use of the microscope on the machine. When the gold capillary wire is in the proper position, the gold ball formed on the end of the capillary wire is brought into contact with the conductive surface of the semiconductor device and the gold ball bonding machine utilizes a combination of heat and ultrasonic energy to attach the gold ball bond to that location. After the initial gold ball is attached, the conventional type of gold ball bonding machine is again brought in contact with that same gold ball to form a wedge bond on top of the gold ball bond. The gold capillary wire needle is then raised, the gold wire is withdrawn and the gold capillary wire normally breaks off to leave a gold wire pigtail depending upwardly from the semiconductor device. In breaking off the gold pigtail the gold ball bonding machine normally breaks the gold capillary wire to leave a pigtail of sufficient length to carry out the purposes of the present invention; that is, leaving a pigtail of approximately 3–4 mils in length depending upwardly. Generally, of course, the same procedure is used to form a plurality of gold balls, one each on the separate conductive surfaces of the semiconductor device, each having gold capillary pigtails depending upwardly.

A flexible microcircuit of approximately 0.017 in. wide and a thickness of about 0.0025 in. and having holes corresponding to each of the thus formed upward gold pigtails is then positioned over the semiconductor device such that the gold capillary pigtails protrude through the conductive holes in the flexible microcircuit. The gold capillary wire is fitted through the holes in the microcircuit and which holes are preferably (internally) coated with a conductive material.

The ball bonding machine is then used to microscopically position another gold ball formed on the end of the gold capillary wire into contact with the tops of each of the gold pigtails that protrude through the microcircuit holes and that gold ball is attached to the top of each pigtail, thereby sandwiching the flexible microcircuit between the gold balls and thereby securing it in conductive relationship to the desired areas of the semiconductor device. The ball bonding machine needle is withdrawn and, again, with the most conventional machines the machine is used again to form a wedge bond atop the ball bond. When the machine needle is again raised, the gold capillary wire pigtails protruding therefrom are automatically severed.

The last step in the technique is to remove the semiconductor device from its substrate by utilizing an appropriate adhesive solvent and the final product is thus a semiconductor device freely suspended in electrical conductive relationship on the end of a flexible microcircuit. dr

DESCRIPTION OF PREFERRED EMBODIMENT

Figure 1:
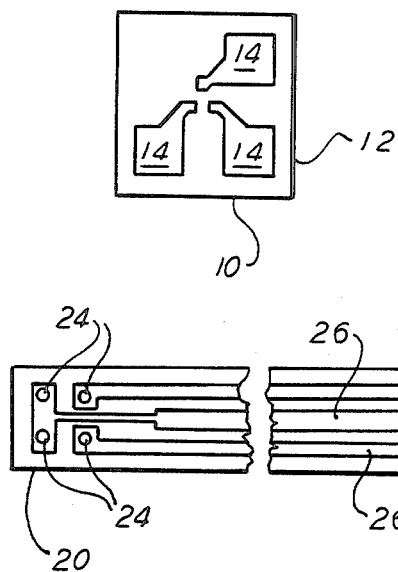
FIG. 1 is a top view of typical semiconductor device showing conductive surfaces.

Turning now to FIG. 1, there is shown the top view of a typical semiconductor device 10 that can be used in carrying out the techniques of the present invention. One typical semiconductor device 10 applicable is a junction field effect transistor (JFET) of the type commercially available from Siliconix Co. and identified as 2N4117A JFET. Such JFET is useable to produce an in vivo medical device for detecting the presence and concentration of blood electrolytes by application thereto of a membrane as shown in Guckel U.S. Pat. No. 4,180,771 and other modifications that are not part of the present invention.

As shown in FIG. 1, therefore, base 12 of semiconductor device 10 is dimensionally approximately 0.017 by 0.017 in. and on which are conductive surfaces 14. On the aforedescribed Siliconix device, as shown, there are three such conductive surfaces 14 and which are generally aluminum or gold coatings on base 12; however, other conductive metals may be used since those conductive surfaces are the terminals to which electrical connection must be made to the semiconductor device 10. In the Siliconix JFET referred to, the conductive surfaces 14 are in the order of about 0.004 in. by 0.004 in. in size thereby affording an area of about $1.6 \times 10^{-5}$ square inches in which to make the electrical connection.

Figure 2:
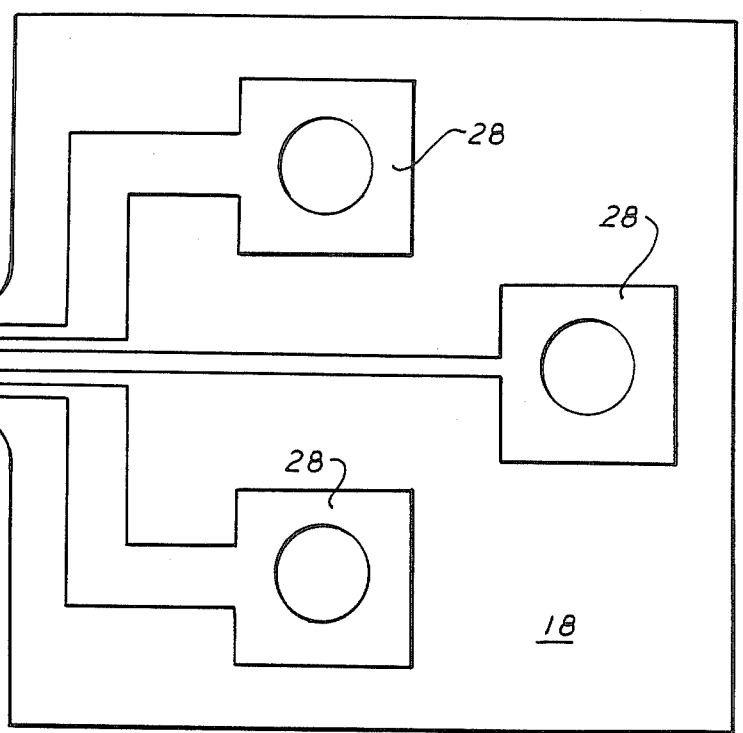
FIG. 2 is a top view of flexible microcircuit used for connection to the semiconductor device of FIG. 1.

In FIG. 2, taken along with FIG. 1, there is shown a flexible microcircuit 16 for providing electrical connection between the semiconductor device 10. For convenience, the end of flexible microcircuit 16 to which semiconductor device 10 is affixed will be referred to as the distal end 20 and the other end of microcircuit 16 will be called the proximal end 22.

The proximal end 22 is ultimately connected through a connection for wiring to the electronics of an instrument for interpreting and displaying the particular parameter detected by the semiconductor device 10. The overall flexible microcircuit 16 can be constructed by commercial companies by a variety of known methods.

The flexible microcircuit 16 generally comprises a base film 18 of a material such as polyimide and having a thickness of approximately 0.002–0.003 in., with its distal end 20 typically having a width of about 0.020 in. or less and has a plurality of holes 24 of approximately 0.002 in. in diameter. Electrical connection between the distal end 20 and the proximal end 22 is provided by a plurality of conductive strips 26 having ends thereof surrounding the holes 24 and having the other ends terminate in connectors 28 in the proximal end 22 for hard-wiring to further apparatus.

In the preferred flexible microcircuit 16, the conductive strips 26 are aluminum coatings on the polyimide although other conductive materials may be used.

A typical flexible microcircuit useable for an in vivo detection device to which the technique of the present invention is applicable has a proximal end 22 of 0.120–0.150 in. in width, an overall length of about 2.5 in. The holes 24 in the distal end 20 are in the order of about 0.007 in. apart on center lines. As shown, in order to function with the particular semiconductor device 10, chosen for illustrative purposes herein, there are three conductive strips 26 and connectors 28, each of which, of course, connect to a different conductive surface 14 of semiconductor device 10.

Figure 3:
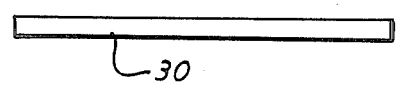
FIG. 3 shows the sequential steps of the method of attaching the flexible microcircuit of FIG. 2 to the semiconductor device of FIG. 1.
Figure 3:
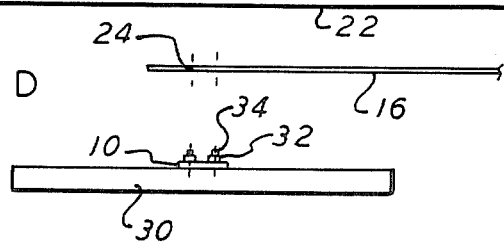
Figure 3:
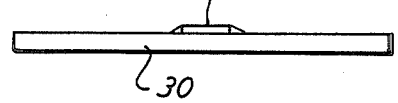
Figure 3:
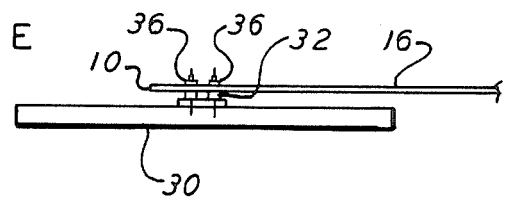
Figure 3:
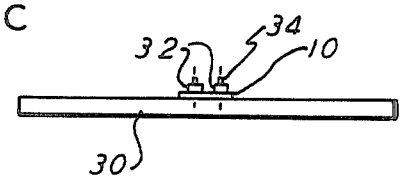
Figure 3:
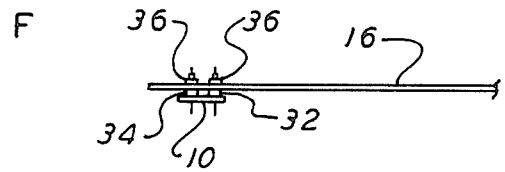

Turning now to FIG. 3, there is shown the sequential steps in carrying out the method of the present invention in attaching a semiconductor device 10 to a flexible microcircuit 16.

The steps to be described in the process are preferably carried out through the use of a gold ball bonding machine. Such machines are commercially available and the use of such machines requires no special modification to carry out the inventive technique described herein.

The description to follow will be specifically detailed for the use of a Model 2402 Thermasonic Gold Ball Bonder, manufactured by Kulicke and Soffa Industries, Inc.; however, the technique can be employed through other similar commercial machines.

The aforedescribed gold ball bonding machine utilizes a spool of gold capillary wire of approximately 0.001 in. in diameter and which is fed through a hollow needle about the size of a hypodermic needle. A built in microscope and micro-controls allows the user to position the free end of the gold capillary wire to an exact location on a semiconductor device and the machine actuated to lower the needle such that the gold capillary wire touches the selected conductive surface of the semiconductor device. In operation of the machine, a gold ball is formed on the free end of the gold capillary wire that extends through the needle.

Energization of the machine allows a combination of ultrasonic energy and heat to affix that gold ball at the end of the capillary gold wire to the conductive surface of the semiconductor device. With the Model 2402 machine the gold capillary wire can thus be played out through the needle as the needle is raised and moved to another position. At the second position, the needle is moved such that the gold ball touches another conductive surface. The application of heat and ultrasonic energy can again be applied and a wedge bond is formed, more of a wedge shape than ball shape. Upon raising the needle from the wedge bond the gold capillary wire is automatically broken off as a result of stress on the gold capillary wire in producing the wedge bond, leaving an upright gold pigtail. Thus, a connection is made between any selected conductive surface of the semiconductor device with the ball bond and a second conductive surface, normally on a fixed container, with a wedge bond; the gold capillary wire of course connecting the two conductive surfaces.

In FIG. 3, Step A is a depiction of the semiconductor device 10 and a substrate 30 which can be a variety of substances and which is used to stabilize the semiconductor device 10 while carrying out the inventive method for ease in handling.

In Step B, therefore, the semiconductor device 10 has been affixed to the substrate 30. Such affixation may be by wax, adhesives, or a preferable means is to glue the two together with a commercial super glue.

Step C shows the semiconductor device 10 having gold balls 32 that have been bonded to one or more of the conductive surfaces thereof. In practicing this invention with the aforementioned Model 2402 Gold Ball Bonding Machine, the gold balls 32 comprise both a gold ball bond upon which has been imposed a gold wedge bond; however, for convenience, the combined ball and wedge bond may be referred to collectively as a gold ball.

A gold ball 32 is thus formed on a selected conductive surface 14 of semiconductor device 10 by microscopically positioning the hollow needle of the gold ball bonding machine over that selected conductive surface 14. The gold capillary wire depends downwardly through the hollow needle and the gold ball is formed on the gold capillary wire. When the hollow needle is properly positioned, the hollow needle is lowered such that the gold ball touches the selective conductive surface. Upon the application of heat and ultrasonic energy, the gold ball is bonded to the selected conductive surface of the semiconductor device. With the Model 2402 Machine, the hollow needle is thereafter raised slightly, allowing the gold capillary wire to play out through the hollow needle and the needle is again lowered so that the gold capillary wire at the top of the hollow needle now touches the top of the previously formed gold bond. By applying heat and ultrasonic energy again, a wedge bond is formed atop the gold bond, the difference being that no ball was at present at the tip end of the gold capillary wire during formation of the wedge bond. Instead, since the gold capillary wire was being played out through the center of the hollow needle, it is merely the wire itself that bonds to the ball bond, thus, the shape of a wedge or wedge bond is formed. The wedge bond also creates stresses in bending the capillary wire to the effect that upon raising the needle again, the gold capillary wire does not readily play out through the hollow needle but actually breaks off leaving a gold capillary pigtail depending upwardly from the wedge bond.

Returning to Step C of FIG. 3, that gold capillary pigtail 34 is shown, and although automatically formed by moving the needle upwardly with the Model 2402 machine after completing the wedge bond on other gold ball bonding machines, heat or other means are utilized and which are used to sever the gold capillary wire at the desired point.

In carrying out this invention it is desired that the gold pigtail 34 depends upwardly about 0.002–0.003 in. in height, the purpose which will become apparent. It is, however, also important that the upright position be at or close to a right angle to the plane of the surface of the semiconductor device 10.

Again, as noted in connection with the particular JFET shown in FIG. 1, there would be formed three gold balls 32 and, of course, three gold pigtails 34 would be depending upwardly from those gold balls 32.

In Step D there is shown the flexible microcircuit 16 positioned over the semiconductor device 10. The positioning is to insure that the center lines of the gold pigtails 34 are aligned with the holes 24 (FIG. 2) in the distal end 20 of flexible microcircuit 16.

As Step E, the flexible microcircuit 16 has been positioned atop semiconductor device 10 such that gold pigtails 34 protrude up through the holes 24 (FIG. 2). Another gold ball 36 is formed atop those gold pigtails 34 by the gold ball bonding machine.

Again, with the Model 2402 machine, the hollow needle of the machine is microscopically located over each of the gold pigtails 34 and the needle lowered to touch the gold ball on the end of the gold capillary wire to each of the pigtails 34. The machine is energized to bond the gold ball on top of each pigtail 34 and, as previously described, a second wedge bond formed thereon. Withdrawing the needle upwardly after forming the wedge bond breaks off the gold capillary wire and leaves the gold balls 36.

Preferably, the pigtails 34, being 0.002–0.003 in. long, protrude upwardly through the flexible microcircuit 16 when in place as in Step E such that the pigtails 34 extend about 0.001 in. through the corresponding holes (FIG. 2) of flexible microcircuit 16.

In Step E, therefore, the flexible microcircuit 16 is held affixed to the semiconductor device 10 by being sandwiched between gold balls 32 and 36 and which form a conductive path through the conductive strips 26 to the proximal end 22 of the semiconductor device 10.

Finally, Step F shows the removal of semiconductor device 10 from substrate 30. This step can be carried out by a variety of means depending upon the type of adhesive used in initially securing semiconductor device 10 to substrate 30. As a preferred means, a cyanoacrylate glue can be used to affix semiconductor device 10 to substrate 30 and a solvent, such as acetone, used for separation thereof.

The end result is a semiconductor device 10 electrically and physically bonded to the distal end 20 of flexible microcircuit 16 such that the electrical connections are accessible at the proximal end 22 of the flexible microcircuit 16 for connection to various electronics. The overall unit is thus small enough to physically be inserted in vivo into a patient's blood vessel for monitoring various parameters, such as pH, electrolytes or the like.

While the present invention has been particularly set forth in terms of specific embodiments thereof, it will be understood in view of the instant disclosure that numerous variations upon the invention are now enabled to those skilled in the art, which variations yet reside within the scope of the instant teaching. Accordingly, the invention is to be broadly construed and limited only by the scope and spirit of the claim now appended hereto.

We claim:

1. A method of joining a semiconductor device having at least one conductive surface to a freestanding flexible microcircuit having holes therein to create an electrical connection therebetween comprising the steps of:

a. bonding a metallic, conductive ball upon the at least one conductive surface of the semiconductor device;

b. forming an upwardly extending conductive pigtail from the conductive ball of predetermined diameter and length;

c. positioning the flexible microcircuit atop the semiconductor device such that the conductive pigtail upwardly protrudes through a hole in the microcircuit; and d. bonding a second conductive ball on the portion of the pigtail that protrudes through the hole in the microcircuit.

2. A method as described in claim 1 in which said metallic, conductive ball is gold.

3. A method as defined in claim 2 wherein said upwardly extending pigtail is about 0.001 in. in diameter and is about 0.003-0.005 in. long.

4. A method of joining in electrical conductive relationship a semiconductor device having a plurality of conductive surfaces to a flexible microcircuit having holes of predetermined size and location using a gold capillary wire to form gold ball bonds comprising the steps of:

a. forming a gold ball at the end of the gold capillary wire;

b. bonding that gold ball to one of the conductive surfaces of the semiconductor;

c. breaking off the gold capillary wire from the gold ball to leave an upwardly extending pigtail of at least a predetermined length;

d. positioning the flexible microcircuit over the semiconductor such that the upwardly extending pigtail of the gold ball extends through one of the holes of the flexible microcircuit;

e. bonding a second gold ball on the portion of the pigtail that extends through the flexible microcircuit; and f. breaking off the gold capillary wire from the second gold ball.

5. A method as described in claim 4 in which said gold capillary wire is of a diameter of about 0.001 in. and said pigtail extends upwardly about 0.003-0.005 in. through the flexible microcircuit.

6. A method of using a golf ball bonding machine having a needle through which a gold capillary wire extends to secure a semiconductor device to the freestanding end of a flexible microcircuit having holes therein, comprising the steps:

a. moving the needle of the gold ball bonding machine to position the gold capillary wire having a gold ball formed on the end thereof over a conductive surface of the semiconductor;

b. lowering the needle such that the gold ball touches the conductive surface;

c. utilizing energy of said ball bonding machine to bond the gold ball to the conductive surface;

d. removing the needle upwardly to break off the gold capillary wire a predetermined length;

e. positioning the flexible microcircuit atop the semiconductor device such that the pigtail extends upwardly through one of the holes in the flexible microcircuit;

f. repositioning the needle of the gold ball bonding machine to position the gold capillary wire having a second gold ball formed on the end thereof over the pigtail that extends through the flexible microcircuit;

g. lowering the needle such that the second gold ball of the gold capillary wire touches said pigtail;

h. utilizing energy of said ball bonding machine to bond the second gold ball to said pigtail; and i. moving the needle to break off the gold capillary wire.

* * * * *

UNITED STATES PATENT AND TRADEMARK OFFICE
CERTIFICATE OF CORRECTION

PATENT NO. : 4,702,003
DATED : October 27, 1987
INVENTOR(S) : Theisen, et al

It is certified that error appears in the above-identified patent and that said Letters Patent is hereby corrected as shown below:

Column 3, line 20, delete "dr".

Column 8, line 10 " ... Using a golf ball ... " should be " ... using a gold ball ... "

Signed and Sealed this

Twenty-ninth Day of August, 1989

Attest:

DONALD J. QUIGG

Attesting Officer

Commissioner of Patents and Trademarks